United States Patent [19]

Shibata et al.

[11] Patent Number: 5,225,268

[45] Date of Patent: Jul. 6, 1993

[54] EPOXY RESIN FILM AND METHOD OF PRODUCING EPOXY RESIN FILM

[75] Inventors: Katsuji Shibata, Shimotsuma; Kazuhito Kobayashi, Yuki; Nozomu Takano, Shimodate; Masami Arai, Shimodate; Ikuo Hoshi, Shimodate, all of Japan

[73] Assignee: Hitachi Chemical Company, Ltd., Tokyo, Japan

[21] Appl. No.: 757,587

[22] Filed: Sep. 11, 1991

[30] Foreign Application Priority Data

Sep. 11, 1990 [JP] Japan .................................. 2-240546
Sep. 11, 1990 [JP] Japan .................................. 2-240547
Sep. 12, 1990 [JP] Japan .................................. 2-242236

[51] Int. Cl.⁵ .................. B32B 27/38; C08G 59/02
[52] U.S. Cl. ........................... 428/220; 428/339; 428/413; 428/330; 528/87; 427/407.2; 427/386
[58] Field of Search ............... 528/87; 428/220, 413, 428/332, 339, 330; 427/386, 407.2

[56] References Cited

U.S. PATENT DOCUMENTS 3,306,872 2/1967 Maycock et al. .................. 528/87
4,778,863 10/1988 Wang et al. .
4,900,801 2/1990 Takata et al. ..................... 528/87
4,921,927 5/1990 Heffner, Jr. et al. ............... 528/87

FOREIGN PATENT DOCUMENTS 1454107 11/1973 United Kingdom .

*Primary Examiner*—P. C. Sluby
*Attorney, Agent, or Firm*—Antonelli, Terry, Stout & Kraus

[57] ABSTRACT

An epoxy resin film which is so strong as to have a tensile strength of not less than 10 MPa and an elongation of not less than 5% is formed by using a substantially linear high molecular weight epoxy resin which is synthesized by polymerizing a difunctional epoxy resin having two epoxy groups per molecule and a dihydric phenol in an aprotic polar solvent, in the presence of a solvent, at a reaction temperature ranging from 80° to 130° C., the difunctional epoxy resin and the dihydric phenol being used in quantities which provide a ratio of phenolic hydroxyl groups to epoxy groups of from 1:0.9 to 1:1.1 and a proportion of the total of them of at most 50% by weight based on the total of them and the aprotic polar solvent.

9 Claims, No Drawings

EPOXY RESIN FILM AND METHOD OF PRODUCING EPOXY RESIN FILM

BACKGROUND OF THE INVENTION (a) Field of the Invention

The present invention relates to an epoxy resin film and a method of producing the epoxy resin film which is excellent in properties including mechanical properties such as strength and elongation and adhesion properties.

(b) Description of the Related Art

The method of producing high molecular weight epoxy resins by employing relatively low molecular weight difunctional epoxy resins and dihydric phenols as polymerization materials is generally called two-stage method, and the first literature on this method is the specification of U.S. Pat. No. 2,615,008 which corresponds to the published specification of Japanese Patent Application filed by the same applicant as the assignee of the U.S. Patent and published under publication No. 28-4494. In these literatures is disclosed a method of producing a higher molecular weight epoxy resin having an epoxy equivalent weight of 5,600 by carrying out a reaction at 150° to 200° C. by using sodium hydroxide as a copolymerizing catalyst in the absence of solvents. The average molecular weight of the obtained epoxy resin is presumed to be about 11,000. In these literatures, however, there is no example where solvents are used.

An example of the literatures in which the use of solvents is disclosed is the specification of U.S. Pat. No. 3,306,872. Particular examples of the literatures in which the use of solvents in working examples is disclosed include Japanese Patent Application Kokai Koho (Laid-open) No. 54-52200, Japanese Patent Application Kokai Koho (Laid-open) No. 60-118757, Japanese Patent Application Kokai Koho (Laid-open) No. 60-118757, Japanese Patent Application Kokai Koho (Laid-open) No. 60-144323 and Japanese Patent Application Kokai Koho (Laid-open) No. 60-114324. The solvents used in these literatures include methyl ethyl ketone, methyl isobutyl ketone, cyclohexanone, ethylene glycol monoethyl ether and ethylene glycol monomethyl ether. These solvents are classified into ketone solvents and ether (cellosolve) solvents.

In the specification of U.S. Pat. No. 3,306,872, either methyl ethyl ketone or ethylene glycol monomethyl ether is used as a solvent, and the concentration of the solids content is 20 to 60% by weight. The catalysts used therein are hydroxides and phenolates of alkyl metals and benzyltrimethylammonium. The polymerization reaction is continued at a temperature of 75° to 150° C. until the weight average molecular weights of the formed high molecular weight epoxy resins increase to at least 40,000 or more. The average molecular weights of the obtained high molecular weight epoxy resins are measured by the viscosity method to be 50,000 to 1,000,000. However, it is known that, in the viscosity method, the calculated average molecular weights are very dependent on the parameters established for the calculation, and, therefore, the average molecular weights of the high molecular weight epoxy resins produced in the U.S. Pat. No. 3,306,872 are not entirely accurate.

Another working example wherein a high molecular weight epoxy resin is supposed to be obtained by carrying out the polymerization in a solvent is disclosed in Japanese Patent Application Kokai Koho (Laid-open) No. 54-52200, in which it is disclosed that a high molecular weight epoxy resin having an average molecular weight of 45,500 is obtained by using ethylene glycol monoethyl ether as a solvent. Further, it is disclosed in Japanese Patent Application Kokai Koho (Laid-open) No. 60-118757 that high molecular weight epoxy resins having average molecular weights of at most 31,000 are obtained by using methyl isobutyl ketone, cyclohexanone or ethylene glycol monoethyl ether as a solvent. In Japanese Patent Application Kokai Koho (Laid-open) No. 60-144323 disclosed is the production of a high molecular weight epoxy resin having an average molecular weight of 53,200 by the use of methyl ethyl ketone as a solvent, and in Japanese Patent Application Kokai Koho (Laid-open) No. 60-144324 disclosed is the production of a high molecular weight epoxy resin having an average molecular weight of 66,000 by the use of methyl ethyl ketone as a solvent. In every one of these four literatures, the average molecular weights are measured by gel permeation chromatography, but the measuring conditions and the calculation methods are not disclosed. The molecular weights measured by gel permeation chromatography vary largely depending on the measuring conditions including the kinds of the fillers used and the kinds of the eluents used and the calculating methods so that it is difficult to obtain accurate average molecular weights, and, therefore, the determined values of the average molecular weights of the high molecular weight epoxy resins produced in these literatures are not entirely accurate.

These high molecular weight epoxy resins which have been known heretofore are not linear high molecular weight epoxy resins but are branched high molecular weight epoxy resins, which cannot be formed into films of 100 μm or less thickness having sufficient strength.

Further, none of the literatures described above disclose that the obtained high molecular weight epoxy resins are able to be formed into film, nor give examples of such epoxy resins. Also, since the obtained epoxy resins are soluble in the solvents other than amide solvents, it is apparent that the methods disclosed in these literatures could not provide so called ultra high molecular weight epoxy resins which are linearly polymerized so highly as to highly as to have the capability of being formed into films having sufficient strength.

A method of producing epoxy resin sheets by using linear high molecular weight epoxy resins is disclosed in Japanese Patent Application Kokai Koho (Laid-open) No. 51-87560. In the method, sheets of 0.3 to 0.5 mm thickness are produced from a mixture prepared by heat-melting linear high molecular weight epoxy resins and low molecular weight epoxy resins and mixing them with salts of organic carboxylic acids. The sheets obtained by the method have a strength of about 10 MPa and an elongation of 350 to 870%. There is disclosed that the linear high molecular weight epoxy resins used have a molecular weight of 30,000 to 250,000, but there is no description concerning the method of measuring the molecular weights, so that it is impossible to compare the molecular weights with the molecular weight of the linear high molecular weight epoxy resin used in the present invention. From working examples which show the capability of the high molecular weight epoxy resins to be heat-melted at 190° C., it is presumable that these epoxy resins have a styrene-conversion weight average molecular weight of less than 50,000 as determined by gel permeation chromatography. As the results of measurements carried out by the present inventors with a differential scanning thermometer, it was proved that linear high molecular weight epoxy resins produced from bisphenol A epoxy resin and bisphenol A have melting points or softening points of 300° C. or higher when their styrene-conversion weight average molecular weights are 50,000 or more, and melting points or softening points of 350° C. or higher when their styrene-conversion weight average molecular weights are 100,000 or more. That is, the high molecular weight epoxy resins disclosed in Japanese Patent Application Kokai Koho (Laid-open) No. 51-87560 are presumed to have considerably lower molecular weights or are much more branched, as compared with the high molecular weight epoxy resins used in the present invention.

SUMMARY OF THE INVENTION

The object of the present invention is to provide an epoxy resin film which is thin in thickness and has a high strength by using a linearly polymerized high molecular weight epoxy resin which has not been obtainable.

That is, the present invention provides an epoxy resin film which has a thickness of not more than 100 µm, a tensile strength of not less than 10 MPa and an elongation of not less than 5% and is made of a high molecular weight epoxy resin being insoluble in methyl ethyl ketone and having a substantially linear structure.

The present invention further provides a suitable method of producing the epoxy resin film of the present invention, which comprises applying a solution of a high molecular weight epoxy resin dissolved in an aprotic polar solvent at a concentration of at most 50% by weight to a plate having a release surface to coat the release surface with the solution of the high molecular weight epoxy resin, the high molecular weight epoxy resin being insoluble in methyl ethyl ketone, having a substantially linear structure, and being prepared by polymerizing a difunctional epoxy resin having two epoxy groups per molecule and a dihydric phenol in an aprotic polar solvent at a reaction temperature ranging from 80° to 130° C., the difunctional epoxy resin and the dihydric phenol being used in quantities which provide a ratio of phenolic hydroxyl groups to epoxy groups of from 1:0.9 to 1:1.1 and a proportion of the total of the difunctional epoxy resin and the dihydric phenol of at most 50% by weight based on the total of the difunctional epoxy resin, the dihydric phenol and the aprotic polar solvent and removing the aprotic polar solvent from the solution of the high molecular weight epoxy resin applied to the release surface of the plate, to form an epoxy resin film having a thickness of not more than 100 µm.

THE PREFERRED EMBODIMENTS OF THE INVENTION

The difunctional epoxy resin to be used in the method of the present invention may be any compound as far as it contains two epoxy groups per molecule, and some examples include bisphenol A epoxy resin, bisphenol F epoxy resin, bisphenol S epoxy resin, alicyclic epoxy resins, aliphatic linear epoxy resins, diglycidyl ethers of dihydric phenols diglycidyl ethers of dihydric alcohols, halides thereof and hydrides thereof. The molecular weights of these compounds are not limited. These compounds may be used individually or as a mixture of two or more of them. The preferred is bisphenol A epoxy resin. Some ingredients other than the difunctional epoxy resin may be contained as impurities so far as they do not affect the operation and accomplishment of the present invention.

The dihydric phenol to be used in the method of the present invention may be any compound as far as it contains two phenolic hydroxyl groups per molecule, and some examples include monocyclic dihydric phenols, such as hydroquinone, resorcinol and catechol, polycyclic dihydric phenols, such as bisphenol A and bisphenol F, halides thereof and alkyl substituted compounds thereof. The molecular weights of these compounds are not limited. These compounds may be used individually or as a mixture of two or more of them. The preferred examples include hydroquinone, resorcinol, bisphenol A and tetrabromobisphenol A, and the particularly preferred examples are hydroquinone, resorcinol and bisphenol A. Some ingredients other than the dihydric phenol may be contained as impurities so far as they do not affect the operation and accomplishment of the present invention.

The catalyst to be used in the method of present invention may be any compound as far as it has the catalytic function of accelerating the etherification between the epoxy groups and the phenolic hydroxyl groups. Some examples of the catalyst include alkali metal compounds, alkaline-earth metal compounds, imidazoles, organic phosphorus compounds such as alkyl phosphines, secondary amines, tertiary amines and quarternary ammonium salts. The preferred are alkali metal compounds, such as hydroxides, halides, organic acid salts, alcoholates, phenolates, hydrides, borohydrides and amides of sodium, lithium and potassium. The particularly preferred examples include sodium hydroxide, lithium hydroxide and sodium methoxide. These catalysts may be used individually or as a mixture of two or more of them.

The aprotic polar solvent to be used in the method of the present invention may be any aprotic polar solvent as far as it dissolves the reaction materials, namely the difunctional epoxy resin and the dihydric phenol, and the product high molecular weight epoxy resin. The preferred examples include amide solvents, such as formamide, N-methylformamide, N,N-dimethylformamide, acetamide, N-methylacetamide, N,N-dimethylacetamide, N,N,N',N'-tetramethylurea, 2-pyrrolidone, N-methylpyrrolidone and carbamates. These solvents may be used individually or as a mixture of two or more of them. Further, these aprotic polar solvents may be used together with other solvents, such as ketone solvents and ether solvents, so far as the operation and accomplishment of the present invention are not affected.

As to the polymerization conditions in the method of the present invention, the difunctional epoxy resin and the dihydric phenol are used in quantities which provide a ratio of phenolic hydroxyl groups to epoxy groups of from 1:0.9 to 1:1.1. When the ratio of phenolic hydroxyl groups to epoxy groups is less than 0.9, the increase of the molecular weight by linear polymerization does not proceed, but crosslinking is caused by side reactions, resulting in a product insoluble in the aprotic polar solvent. When the ratio of phenolic hydroxyl groups to epoxy groups is more than 1.1, the increase of the molecular weight does not proceed sufficiently.

Although the quantity of the catalyst is not particularly limited, the catalyst, generally, is used in a quantity of 0.0001 to 0.2 mol per 1 mol of the difunctional epoxy resin. When the quantity of the catalyst is less than the range, the increase of the molecular weight may be slowed down severely, and when it is larger than the range, side reactions may increase, thereby preventing the increase of the molecular weight by linear polymerization.

The preferred range of the reaction temperature is 80° to 130° C. When the reaction temperature is lower than 80° C., the increase of the molecular weight may be slowed down severely, and when it is higher than 130° C., side reactions may increase, thereby preventing the increase of the molecular weight by linear polymerization.

The solids concentration during the polymerization, namely the proportion of the total of the difunctional epoxy resin and the dihydric phenol based on the total of the difunctional epoxy resin, the dihydric phenol and the aprotic polar solvent, is at most 50% by weight. The preferred concentration is less than 30% by weight. The higher the solids concentration is, the more the side reactions occur to make the increase of the molecular weight by linear polymerization difficult. When the polymerization is carried out with a relatively high solids concentration, lowering the reaction temperature and decreasing the quantity of the catalyst used make it possible to obtain linear ultra high molecular weight epoxy resins.

The high molecular weight epoxy resin obtained by using the above-described difunctional epoxy resin, dihydric phenol, catalyst and aprotic polar solvent according to the present invention is insoluble in methyl ethyl ketone, and it generally has a styrene-conversion weight average molecular weight of more than about 20,000 as measured by gel permeation chromatography. For example, a highly branched high molecular weight epoxy resin is soluble in ketone solvents in spite of its high styrene-conversion average molecular weight of 110,000, but on the contrary, a linear high molecular weight epoxy resin is insoluble in methyl ethyl ketone in spite of its lower styrene-conversion weight average molecular weight of 66,000. Linear high molecular weight epoxy resins cannot be dissolved completely in methyl ethyl ketone unless they have styrene-conversion weight average molecular weights of about 20,000 or less.

Among the high molecular weight epoxy resins obtained by the above-described method, the preferred are linear ultra high molecular weight epoxy resins having styrene-conversion weight average molecular weights of at least 50,000, more preferably at least 100,000, as measured by gel permeation chromatography, and reduced viscosities $[\eta_{sp}/c]$ of at least 0.6 dl/g, as measured in N,N-dimethylacetamide at a concentration of 0.3 g/dl at 30° C.

The high molecular weight epoxy resin to be used in the present invention preferably has a viscosity of at least 1,000 mPa.s, more preferably at least 2,000 mPa.s, as measured in N,N-dimethylacetamide at a concentration of 20% by weight at 25° C.

In the method of the present invention, a solution of the high molecular weight epoxy resin dissolved in an aprotic polar solvent at a concentration of at most 50% by weight, preferably 15 to 50% by weight, is used to coat the plate having a release surface. A concentration of more than 50% by weight may make the viscosity of the solution increase excessively and the application of the solution be impossible. The preferred examples of the aprotic polar solvent to be used for the preparation of the solution of the high molecular weight epoxy resin are amide solvents, and the aprotic polar solvents may be identical with or different from the aprotic polar solvent used in the polymerization reaction.

The solution of the high molecular epoxy resin preferably contains no ingredients other than the aprotic polar solvent and the high molecular weight epoxy resin obtained by the polymerization of the difunctional epoxy resin and the dihydric phenol.

Further, the reaction solution containing the high molecular weight epoxy resin obtained by the polymerization may be used as the solution of the high molecular weight epoxy resin to be applied to the plate. In this case, the reaction solution may be used as it is, or may be concentrated by removing a portion of the aprotic polar solvent used in the polymerization or be diluted by adding an aprotic polar solvent which is identical with or different from the solvent used in the polymerization in order to adjust the viscosity of the solution properly. In this case, the solution preferably contains no ingredients other than the aprotic polar solvent used in the polymerization, the aprotic polar solvent added, if any, the catalyst used in the polymerization and the high molecular weight epoxy resin obtained by the polymerization of the difunctional epoxy resin and the dihydric phenol.

The solution of the high molecular weight epoxy resin is then applied to a plate having a release surface to coat the release surface with the solution of the high molecular weight epoxy resin.

The plate may be any plate, such as a metal plate, glass plate, ceramic plate or plastics plate, as far as it has a release surface, are resistant to the solvent in the solution and are made of a relatively hard material. The plate may have a form of a roll.

Subsequently, the aprotic polar solvent is removed from the solution of the high molecular weight epoxy resin applied to the plate to form an epoxy resin film with a thickness of not more than 100 μm. The removal of the aprotic polar solvent may be performed by a method of drying by heating or by a method wherein the plate coated with the solution of the high molecular weight epoxy resin is dipped in a solvent for solvent-exchange which is miscible with the aprotic polar solvent but does not dissolve the high molecular weight epoxy resin, to perform solvent-exchange, and then drying is carried out by heating.

When the removal of the aprotic polar solvent is performed by drying, the drying temperature is not particularly limited as far as it is not higher than the decomposition temperature of the high molecular weight epoxy resin (generally about 350° C.). The drying may be carried out at a reduced pressure. It is preferable to carry out the drying in the air or in an inert atmosphere, for example, in nitrogen gas, argon gas or helium gas atmosphere.

When the removal of the aprotic polar solvent is performed by the method employing the solvent-exchange technique, the solvent to be used for the solvent-exchange may be any solvent other than aprotic polar solvents as far as it is miscible with the aprotic polar solvent used in the solution of the high molecular weight epoxy resin and does not dissolve the high molecular weight epoxy reiin. When the aprotic polar solvent used in the solution of the high molecular weight epoxy resin is an amide solvent, some examples of the solvent for solvent-exchange include water, alcohol solvents such as methanol, ethanol, propanol and butanol, hydrocarbon solvents such as hexane, cyclohexane and toluene, ester solvents such as ethylacetate and propyl acetate, ether solvents such as diethyl ether and tetrahydrofuran, ketone solvents such as acetone, methyl ethyl ketone, methyl isobutyl ketone and halogenized hydrocarbon solvents such as chloroform and methylene chloride.

In the step of solvent-exchange, the high molecular weight epoxy resin which is coating the surface of the plate in a state of a solution dissolved in the aprotic polar solvent (good solvent) is deposited by the excessive amount of solvent for solvent-exchange (bad solvent).

When it is difficult to deposit the high molecular weight epoxy resin by a single solvent exchange using a desired solvent for solvent-exchange, such as a solvent having a low boiling point or water, solvent-exchange may be carried out once or more by using other solvents which are more miscible with the aprotic polar solvent than the desired solvent for solvent-exchange prior to the solvent exchange using the desired solvent. For example, when solvent-exchange is carried out twice to complete the deposition of the high molecular weight epoxy resin by the second solvent-exchange using a desired solvent for solvent-exchange, examples of the combination of two different solvents for solvent-exchange are an alcohol solvent/water, an alcohol solvent/an ether solvent, an alcohol solvent/an ester solvent, and an ether solvent/a ketone solvent.

When the removal of the aprotic polar solvent is performed by employing the solvent-exchange and drying, the preferred thickness of the applied solution of the high molecular weight epoxy resin is 2 mm or less. The solvent-exchange, generally, is carried out for 5 to 120 minutes at 20° to 80° C.

At the time of drying after the solvent-exchange, the drying temperature is not particularly limited as far as it is not higher than the decomposition temperature of the high molecular weight epoxy resin (generally about 350° C.). The drying may be carried out at a reduced pressure. It is preferable to carry out the drying in the air or in an inert atmosphere, for example, in nitrogen gas, argon gas or helium gas atmosphere.

Using a solvent for solvent-exchange having a low boiling point enables drying at a relatively low temperature. Drying at a relatively low temperature makes it extremely easy to endow the dried epoxy resin film with adhesion properties. Further, when a solvent with strong polarity such as water is used as the solvent for solvent-exchange, metal ions contained in the raw materials, in particular the catalysts, can be washed off from the epoxy resin film, and the electric insulating properties can be increased.

Because the epoxy resin film of the present invention is produced by using a substantially linear high molecular weight epoxy resin which is substantially free from branching, film formation can be performed without modifying the high molecular weight epoxy resin with other resins. The epoxy resin film obtained by the present invention has a high glass transition temperature, has a high mechanical strength even if it is thin, and is excellent in adhesion properties because it contains many polar groups in its skeleton structure.

That is, according to the method of the present invention, an epoxy resin film of at most 100 μm thickness having a tensile strength of 10 MPa or more, further 20 MPa or more, and an elongation of 5% or more, further 10% or more, furthermore 50% or more can be obtained. Further, it is possible to obtain an epoxy resin film having a glass transition temperature of 80° C. or more, further 100° C. or more. It is also possible to form an epoxy resin film of 50 μm or less thickness.

When a plastic film is used in place of the plate having a release surface, a multilayer film having a tensile strength of 10 MPa or more, further 20 MPa or more, and an elongation of 5% or more, further 10% or more, furthermore 50% or more, can be obtained. The plastic film to be coated with the solution of the high molecular weight epoxy resin is not limited as far as it is insoluble in methyl ethyl ketone or ethylene glycol monoethyl ether and the aprotic polar solvent in the solution of the high molecular weight epoxy resin. From the view point of the solvent resistance, heat decomposition temperature and strength, the preferred examples are polyimide film, polyester film, polyethylene film and polypropylene film.

In the production of the multilayer film, the drying temperature is not limited as far as it is lower than the decomposition temperature of the high molecular weight epoxy resin and the plastics film.

The epoxy resin film of the present invention is very thin in thickness and has high strength and high elongation and, therefore, is useful particularly as an adhesive film for copper clad laminates and as an interlaminar material for multilayer boards.

The present invention will be described in more detail with reference to the following Examples. These Examples, however, are not to be construed to limit the scope of the invention.

EXAMPLES 1 TO 35 AND COMPARATIVE EXAMPLES 1 TO 7

The measurements carried out in the following Examples and Comparative Examples were conducted in the manner as described below.

The viscosities of the reaction solutions were measured by using an EMD-model viscometer (produced by Tokyo Keiki Co., Ltd.).

Gel permeation chromatography was operated by using a column of TSK gel G6000+G5000+G4000+G3000+G2000. N,N-dimethylacetamide was used as an eluent, with the concentration of samples adjusted to 2% by weight. After the relationship between the molecular weight and the elution time was obtained by using polystyrenes having various molecular weights, the molecular weights of samples were calculated from their elution time as styrene-conversion weight average molecular weights.

The photometer used in the determination of the weight average molecular weights by light scattering method was a DLS-700 produced by Ohtsuka Electronics Co., Ltd.

The reduced viscosities were measured in N,N-dimethylacetamide as a solvent at a concentration of 0.3 g/dl at 30° C.

Measurements of the tensile strength, elongation and tensile modulus were conducted by using TENSILON produced by Orientic Co., Ltd. The samples of films had a size of 50×10 mm, and the tensile speed was 5 mm/min.

The glass transition temperatures (Tg) were measured by using a 910 differential scanning calorimeter (DSC) produced by E.I. Du Pont de Nemours and Company.

The heat decomposition temperature is the temperature for onset of reduction in weight in the air which was measured by using a differential thermobalance, TGD-3000, produced by ULVAC Corp.

EXAMPLES 1 TO 5

Solutions of high molecular weight epoxy resins having different molecular weights were prepared by carrying out polymerization under the conditions shown in Table 1 by using, in each Example, 1.000 epoxy equivalent of a bisphenol A epoxy resin (epoxy equivalent weight: 171.5) as a difunctional epoxy resin, bisphenol A (hydroxyl equivalent weight: 115.0) as a dihydric phenol in a quantity which provides the ratio of phenolic hydroxyl groups to epoxy groups shown in Table 1, 1.62 g of sodium methoxide as a catalyst and N,N-dimethylacetamide as a solvent in a quantity which provides the solids concentration (the proportion of the total of bisphenol A epoxy resin and bisphenol A based on the total of bisphenol A epoxy resin, bisphenol A and N,N-dimethylacetamide) shown in Table 1.

These solutions of high molecular weight epoxy resins were applied to glass plates and then dried by heating in a drier to obtain epoxy resin films under the conditions shown in Table 1, and the properties of the obtained epoxy resin films were evaluated. The results are shown in Table 1.

The high molecular weight epoxy resins produced by the above polymerization were insoluble in methyl ethyl ketone.

EXAMPLE 6 TO 10

Solutions of high molecular weight epoxy resins having different molecular weights were prepared by carrying out polymerization under the conditions shown in Table 2 by using, in each Example, 1.000 epoxy equivalent of a bisphenol A epoxy resin (epoxy equivalent weight: 171.5) as a difunctional epoxy resin, hydroquinone (hydroxyl equivalent weight: 55.7) as a dihydric phenol in a quantity which provides the ratio of phenolic hydroxyl groups to epoxy groups shown in Table 2, 0.72 g of lithium hydroxide as a catalyst and N,N-dimethylacetamide as a solvent in a quantity which provides the solids concentration (the proportion of the total of bisphenol A epoxy resin and hydroquinone based on the total of bisphenol A epoxy resin, hydroquinone and N,N-dimethylacetamide) shown in Table 2.

These solutions of high molecular weight epoxy resins were applied to glass plates and then dried by heating in a drier to obtain epoxy resin films under the conditions shown in Table 2, and the properties of the obtained epoxy resin films were evaluated. The results are shown in Table 2.

The high molecular weight epoxy resins produced by the above polymerization were insoluble in methyl ethyl ketone.

EXAMPLES 11 TO 15

Solutions of high molecular weight epoxy resins having different molecular weights were prepared by carrying out polymerization under the conditions shown in Table 3 by using, in each Example, 1.000 epoxy equivalent of a bisphenol A epoxy resin (epoxy equivalent weight: 171.5) as a difunctional epoxy resin, resorcinol (hydroxyl equivalent weight: 55.4) as a dihydric phenol in a quantity which provides the ratio of phenolic hydroxyl groups to epoxy groups shown in Table 3, 1.20 g of sodium hydroxide as a catalyst and N,N-dimethylacetamide as a solvent in a quantity which provides the solids concentration (the proportion of the total of bisphenol A epoxy resin and resorcinol based on the total of bisphenol A epoxy resin, resorcinol and N,N-dimethylacetamide) shown in Table 3.

These solutions of high molecular weight epoxy resins were applied to stainless steel plates and then dried by heating in a drier to obtain epoxy resin films under the conditions shown in Table 3, and the properties of the obtained epoxy resin films were evaluated. The results are shown in Table 3.

The high molecular weight epoxy resins produced by the above polymerization were insoluble in methyl ethyl ketone.

EXAMPLES 16 TO 20

Solutions of high molecular weight epoxy resins having different molecular weights were prepared by carrying out polymerization under the conditions shown in Table 4 by using, in each Example, 1.000 epoxy equivalent of a bisphenol A epoxy resin (epoxy equivalent weight: 171.5) as a difunctional epoxy resin, hydroquinone (hydroxyl equivalent weight: 55.7) as a dihydric phenol in a quantity which provides the ratio of phenolic hydroxyl groups to epoxy groups shown in Table 4, 1.62 g of sodium methoxide as a catalyst and N-methylpyrrolidone as a solvent in a quantity which provides the solids concentration (the proportion of the total of bisphenol A epoxy resin and hydroquinone based on the total of bisphenol A epoxy resin, hydroquinone and N-methylpyrrolidone) shown in Table 4.

These solutions of high molecular weight epoxy resins were applied to glass plates and then dried by heating in a drier to obtain epoxy resin films under the conditions shown in Table 4, and the properties of the obtained epoxy resin films were evaluated. The results are shown in Table 4.

The high molecular weight epoxy resins produced by the above polymerization were insoluble in methyl ethyl ketone.

EXAMPLES 21 TO 25

Solutions of high molecular weight epoxy resins having different molecular weights were prepared by carrying out polymerization under the conditions shown in Table 5 by using, in each Example, 1.000 epoxy equivalent of a bisphenol A epoxy resin (epoxy equivalent weight: 179.2) as a difunctional epoxy resin, bisphenol A (hydroxyl equivalent weight: 115.0) as a dihydric phenol in a quantity which provides the ratio of phenolic hydroxyl groups to epoxy groups shown in Table 5, 1.62 g of sodium methoxide as a catalyst and N,N-dimethylacetamide as a solvent in a quantity which provides the solids concentration (the proportion of the total of bisphenol A epoxy resin and bisphenol A based on the total of bisphenol A epoxy resin, bisphenol A and N,N-dimethylacetamide) shown in Table 5.

These solutions of high molecular weight epoxy resins were applied to glass plates and then dried by heating in a drier to obtain epoxy resin films under the conditions shown in Table 5, and the properties of the obtained epoxy resin films were evaluated. The results are shown in Table 5.

The high molecular weight epoxy resins produced by the above polymerization were insoluble in methyl ethyl ketone.

The effects of the present invention taken in these Examples were confirmed by the following Comparative Examples.

COMPARATIVE EXAMPLES 1 TO 5

Solutions of high molecular weight epoxy resins having different molecular weights were prepared by carrying out polymerization under the conditions shown in Table 6 by using, in each Example, 1.000 epoxy equivalent of a bisphenol A epoxy resin (epoxy equivalent weight: 171.5) as a difunctional epoxy resin, bisphenol A (hydroxyl equivalent weight: 115.0) as a dihydric phenol in a quantity which provides the ratio of phenolic hydroxyl groups to epoxy groups shown in Table 6, 1.62 g of sodium methoxide as a catalyst and N,N-dimethylacetamide (Comparative Examples 1-3), methyl isobutyl ketone (Comparative Example 4) or ethylene glycol monoethyl ether (Comparative Example 5) as a solvent in a quantity which provides the solids concentration (the proportion of the total of bisphenol A epoxy resin and bisphenol A based on the total of bisphenol A epoxy resin, bisphenol A and N,N-dimethylacetamide) shown in Table 6. The obtained high molecular weight epoxy resins were soluble in methyl ethyl ketone.

These solutions of high molecular weight epoxy resins were applied to glass plates and then dried by heating in a drier to obtain epoxy resin films under the conditions shown in Table 6, and the properties of the obtained epoxy resin films were evaluated. The results are shown in Table 6. In Comparative Examples 1 to 3, films of 100 μm or less could not be formed.

COMPARATIVE EXAMPLE 6

The average molecular weight of a commercial phenoxy resin, YP50P (trademark, produced by), which is a high molecular weight epoxy resin, was determined. The styrene-conversion weight average molecular weight of the epoxy resin was 68,000 as determined by gel permeation chromatography and 77,000 as determined by light scattering method. The phenoxy resin had a reduced viscosity of 0.488 dl/g. The phenoxy resin was dissolved in methyl ethyl ketone easily. A 20% by weight solution of the phenoxy resin in N,N-dimethylacetamide had a viscosity of 200 mPa.s at 25° C. The solution of the phenoxy resin was applied to a glass plate and dried by heating in an drier in order to form epoxy resin films, but films having a thickness of 100 μm or less could not be obtained.

COMPARATIVE EXAMPLE 7

The average molecular weight of a commercial diallyl phthalate resin, DT170 (trademark, produced by Tohto Kasei Co., Ltd.), which is a high molecular weight epoxy resin, was determined. The styrene-conversion weight average molecular weight of the epoxy resin was 145,000 as determined by gel permeation chromatography and 61,000 as determined by light scattering method. The diallyl phthalate resin had a reduced viscosity of 0.105 dl/g. The dially phthalate resin was dissolved in methyl ethyl ketone easily. A 30% by weight solution of the diallyl phthalate resin in N,N-dimethylacetamide had a viscosity of 100 mpa.s. The solution of the diallyl phthalate resin was applied to a glass plate and dried by heating in an drier in order to form epoxy resin films, but films having a thickness of 100 μm or less could not be obtained.

TABLE 1

|  | Example 1 | Example 2 | Example 3 | Example 4 | Example 5 |
|---|---|---|---|---|---|
| Polymerization conditions |  |  |  |  |  |
| Ratio of the dihydric phenol | 1.000 | 1.000 | 0.998 | 1.002 | 1.005 |
| Solids concentration (% by weight) | 20 | 20 | 20 | 20 | 20 |
| Reaction temperature (°C.) | 120 | 120 | 120 | 120 | 120 |
| Reaction time (h) | 2.0 | 2.0 | 2.0 | 2.0 | 2.0 |
| Properties of the resultant epoxy resin |  |  |  |  |  |
| Viscosity (mPa · s) | 9,100 | 9,100 | 14,300 | 6,400 | 2,900 |
| Weight average molecular weight |  |  |  |  |  |
| GPC | 295,000 | 295,000 | 421,000 | 216,000 | 170,000 |
| Light scattering method | 271,000 | 271,000 | 383,000 | 198,000 | 155,000 |
| Reduced viscosity [η sp/C] (dl/g) | 1.240 | 1.240 | 1.305 | 1.195 | 1.140 |
| Film forming conditions |  |  |  |  |  |
| Drying temperature (°C.) | 200 | 250 | 250 | 200 | 200 |
| Drying time (h) | 1.0 | 1.0 | 1.0 | 1.0 | 1.0 |
| Properties of epoxy resin film |  |  |  |  |  |
| Thickness (μm) | 18 | 17 | 22 | 19 | 15 |
| Tensile strength (MPa) | 45.9 | 52.2 | 63.8 | 37.1 | 30.9 |
| Elongation (%) | 81 | 72 | 94 | 68 | 52 |
| Tensile modulus (MPa) | 1580 | 1670 | 1980 | 1490 | 1390 |
| Glass transition temperature (°C.) | 113 | 117 | 121 | 107 | 105 |
| Heat decomposition temperature (°C.) | 348 | 345 | 352 | 336 | 333 |

In Tables 1 to 6. Viscosity means the viscosity of 20% by weight solution of the obtained high molecular weight epoxy resin in N,N-dimethylacetamide measured at 25° C.

TABLE 2

|  | Example 6 | Example 7 | Example 8 | Example 9 | Example 10 |
|---|---|---|---|---|---|
| Polymerization conditions |  |  |  |  |  |
| Ratio of the dihydric phenol | 1.002 | 1.005 | 1.010 | 1.015 | 1.020 |
| Solids concentration (% by weight) | 20 | 20 | 20 | 20 | 20 |
| Reaction temperature (°C.) | 120 | 120 | 120 | 120 | 120 |
| Reaction time (h) | 2.5 | 2.5 | 2.5 | 2.5 | 2.5 |
| Properties of the resultant epoxy resin |  |  |  |  |  |
| Viscosity (mPa · s) | 14,300 | 10,900 | 8,700 | 5,100 | 2,400 |
| Weight average molecular weight |  |  |  |  |  |
| GPC | 769,000 | 625,000 | 576,000 | 436,000 | 307,000 |
| Light scattering method | 693,000 | 559,000 | 512,000 | 385,000 | 255,000 |
| Reduced viscosity [η sp/C] (dl/g) | 1.325 | 1.295 | 1.270 | 1.240 | 1.165 |
| Film forming conditions |  |  |  |  |  |
| Drying temperature (°C.) | 200 | 200 | 200 | 200 | 200 |
| Drying time (h) | 1.0 | 1.0 | 1.0 | 1.0 | 1.0 |
| Properties of epoxy resin film |  |  |  |  |  |
| Thickness (μm) | 22 | 24 | 19 | 21 | 17 |
| Tensile strength (MPa) | 48.1 | 45.6 | 40.6 | 41.2 | 32.7 |
| Elongation (%) | 165 | 101 | 128 | 76 | 79 |

TABLE 2-continued

| | Example 6 | Example 7 | Example 8 | Example 9 | Example 10 |
|---|---|---|---|---|---|
| Tensile modulus (MPa) | 930 | 1210 | 750 | 760 | 480 |
| Glass transition temperature (°C.) | 88 | 84 | 89 | 81 | 75 |
| Heat decomposition temperature (°C.) | 326 | 320 | 331 | 329 | 323 |

TABLE 3

| | Example 11 | Example 12 | Example 13 | Example 14 | Example 15 |
|---|---|---|---|---|---|
| Polymerization conditions | | | | | |
| Ratio of the dihydric phenol | 1.000 | 1.002 | 1.005 | 1.010 | 1.020 |
| Solids concentration (% by weight) | 20 | 20 | 20 | 20 | 20 |
| Reaction temperature (°C.) | 120 | 120 | 120 | 120 | 120 |
| Reaction time (h) | 3.5 | 3.5 | 3.5 | 3.5 | 3.5 |
| Properties of the resultant epoxy resin | | | | | |
| Viscosity (mPa·s) | 2,900 | 2,200 | 1,900 | 1,100 | 700 |
| Weight average molecular weight | | | | | |
| GPC | 451,000 | 389,000 | 326,000 | 211,000 | 155,000 |
| Light scattering method | 401,000 | 347,000 | 292,000 | 182,000 | 130,000 |
| Reduced viscosity [η sp/C] (dl/g) | 1.240 | 1.212 | 1.200 | 1.095 | 1.010 |
| Film forming conditions | | | | | |
| Drying temperature (°C.) | 200 | 200 | 200 | 200 | 200 |
| Drying time (h) | 1.0 | 1.0 | 1.0 | 1.0 | 1.0 |
| Properties of epoxy resin film | | | | | |
| Thickness (μm) | 25 | 21 | 20 | 22 | 20 |
| Tensile strength (MPa) | 42.9 | 46.3 | 40.1 | 38.7 | 29.1 |
| Elongation (%) | 133 | 156 | 220 | 108 | 83 |
| Tensile modulus (MPa) | 960 | 890 | 1090 | 1010 | 780 |
| Glass transition temperature (°C.) | 83 | 80 | 82 | 75 | 77 |
| Heat decomposition temperature (°C.) | 330 | 329 | 329 | 337 | 335 |

TABLE 4

| | Example 16 | Example 17 | Example 18 | Example 19 | Example 20 |
|---|---|---|---|---|---|
| Polymerization conditions | | | | | |
| Ratio of the dihydric phenol | 0.998 | 1.000 | 1.002 | 1.005 | 1.010 |
| Solids concentration (% by weight) | 20 | 20 | 20 | 20 | 20 |
| Reaction temperature (°C.) | 120 | 120 | 120 | 120 | 120 |
| Reaction time (h) | 2.0 | 2.0 | 2.0 | 2.0 | 2.0 |
| Properties of the resultant epoxy resin | | | | | |
| Viscosity (mPa·s) | 8,200 | 4,000 | 3,200 | 2,500 | 2,000 |
| Weight average molecular weight | | | | | |
| GPC | 189,000 | 215,000 | 201,000 | 140,000 | 117,000 |
| Light scattering method | 179,000 | 202,000 | 195,000 | 114,000 | 110,000 |
| Reduced viscosity [η sp/C] (dl/g) | 0.942 | 1.010 | 1.035 | 0.910 | 0.880 |
| Film forming conditions | | | | | |
| Drying temperature (°C.) | 250 | 250 | 250 | 250 | 250 |
| Drying time (h) | 1.0 | 1.0 | 1.0 | 1.0 | 1.0 |
| Properties of epoxy resin film | | | | | |
| Thickness (μm) | 18 | 13 | 13 | 16 | 12 |
| Tensile strength (MPa) | 50.4 | 58.1 | 50.1 | 41.9 | 25.7 |
| Elongation (%) | 79 | 44 | 99 | 56 | 78 |
| Tensile modulus (MPa) | 1290 | 1100 | 1330 | 930 | 500 |
| Glass transition temperature (°C.) | 101 | 100 | 107 | 98 | 90 |
| Heat decomposition temperature (°C.) | 358 | 349 | 350 | 344 | 348 |

TABLE 5

| | Example 21 | Example 22 | Example 23 | Example 24 | Example 25 |
|---|---|---|---|---|---|
| Polymerization conditions | | | | | |
| Ratio of the dihydric phenol | 0.990 | 0.995 | 1.000 | 1.005 | 1.010 |
| Solids concentration (% by weight) | 20 | 20 | 20 | 20 | 20 |
| Reaction temperature (°C.) | 120 | 120 | 120 | 120 | 120 |
| Reaction time (h) | 2.0 | 2.0 | 2.0 | 2.0 | 2.0 |
| Properties of the resultant epoxy resin | | | | | |
| Viscosity (mPa·s) | 3,800 | 4,800 | 3,000 | 1,900 | 700 |
| Weight average molecular weight | | | | | |
| GPC | 88,000 | 119,000 | 114,000 | 94,000 | 63,000 |
| Light scattering method | 89,000 | 115,000 | 109,000 | 96,000 | 60,000 |
| Reduced viscosity [η sp/C] (dl/g) | 0.805 | 0.952 | 0.903 | 0.854 | 0.880 |
| Film forming conditions | | | | | |
| Drying temperature (°C.) | 200 | 250 | 250 | 200 | 200 |
| Drying time (h) | 1.0 | 1.0 | 1.0 | 1.0 | 1.0 |
| Properties of epoxy resin film | | | | | |
| Thickness (μm) | 19 | 23 | 25 | 17 | 16 |
| Tensile strength (MPa) | 34.9 | 31.0 | 25.7 | 22.6 | 20.0 |
| Elongation (%) | 66 | 61 | 80 | 60 | 51 |
| Tensile modulus (MPa) | 390 | 400 | 570 | 300 | 260 |
| Glass transition temperature (°C.) | 98 | 91 | 94 | 87 | 89 |
| Heat decomposition temperature (°C.) | 339 | 340 | 341 | 337 | 335 |

TABLE 6

| | Comparative Example 1 | Comparative Example 2 | Comparative Example 3 | Comparative Example 4 | Comparative Example 5 |
|---|---|---|---|---|---|
| Polymerization conditions | | | | | |
| Ratio of the dihydric phenol | 0.700 | 0.800 | 0.850 | 1.000 | 1.000 |
| Solids concentration (% by weight) | 20 | 20 | 20 | 20 | 20 |

TABLE 6-continued

|  | Comparative Example 1 | Comparative Example 2 | Comparative Example 3 | Comparative Example 4 | Comparative Example 5 |
|---|---|---|---|---|---|
| Reaction temperature (°C.) | 100 | 100 | 100 | 100 | 100 |
| Reaction time (h) | 1.5 | 2.5 | 3.0 | 2.0 | 3.5 |
| Properties of the resultant epoxy resin |  |  |  |  |  |
| Viscosity (mPa · s) | 600 | 900 | 2,800 | 900 | 1,100 |
| Weight average molecular weight |  |  |  |  |  |
| GPC | 123,000 | 155,000 | 111,000 | 35,000 | 67,000 |
| Light scattering method | 101,000 | 138,000 | 110,000 | 38,000 | 66,000 |
| Reduced viscosity [η sp/C] (dl/g) | 0.459 | 0.550 | 0.555 | 0.450 | 0.509 |
| Film forming conditions |  |  |  |  |  |
| Drying temperature (°C.) | 200 | 200 | 200 | 200 | 200 |
| Drying time (h) | 1.0 | 1.0 | 1.0 | 1.0 | 1.0 |
| Properties of epoxy resin film |  |  |  |  |  |
| Thickness (μm) | — | — | — | 27 | 25 |
| Tensile strength (MPa) | — | — | — | 6.8 | 9.0 |
| Elongation (%) | — | — | — | 13 | 32 |
| Tensile modulus (MPa) | — | — | — | 150 | 345 |
| Glass transition temperature (°C.) | — | — | — | 88 | 95 |
| Heat decomposition temperature (°C.) | — | — | — | 340 | 338 |

In Comparative Examples 1 to 3, it is presumed that the excessive amounts of the epoxy resins caused much branching, and no films of 100 μm or less thickness could be obtained although the obtained high molecular weight epoxy resins had considerably high molecular weight of 100,000 or more.

In Comparative Examples 4 and 5 wherein solvents other than aprotic polar solvents were used as polymerization solvents, the obtained high molecular weight epoxy resins were soluble in methyl ethyl ketone, and the films formed from the epoxy resins had low tensile strengths.

Also, as described in Comparative Examples 6 and 7, although the phenoxy resin and diallyl phthalate resin, which are commercial bisphenol A ultra high molecular weight epoxy resins, had considerably high molecular weights, these resins were dissolved in methyl ethyl ketone, and the viscosities of the 20% by weight solution of these resins in N,N-dimethylacetamide were extremely lower than those of the ultra molecular weight epoxy resins obtained according to the present invention. These commerial resins also could not be formed into films having a thickness of 100 μm or less.

As another Comparative Example, an epoxy resin having a relatively low molecular weight was prepared by using the same reactions materials and in the same quantities as those employed in Example 1. The epoxy resin could be formed into a film, but had an extremely low strength.

On the contrary to Comparative Examples, all Examples could provide epoxy resin films having thicknesses of less than 100 μm and sufficient strength.

EXAMPLE 26

171.3 g of a bisphenol A epoxy resin (epoxy equivalent weight: 171.3) as a difunctional epoxy resin, 115.5 g of bisphenol A (hydroxyl equivalent weight: 115.5) as a dihydric phenol and 1.62 g of sodium methoxide as a catalyst were dissolved in N,N-dimethylacetamide as a solvent to prepare a reaction solution having a solids concentration (the proportion of the total of the bisphenol A epoxy resin and bisphenol A based on the total of the bisphenol A epoxy resin, bisphenol A and N,N-dimethylacetamide) of 20% by weight. The temperature of the reaction system was maintained at 120° C. for 6 hours to obtain a solution of a high molecular weight epoxy resin. The obtained high molecular weight epoxy resin had a viscosity of 6,800 mPa.s as measured in N,N-dimethylacetamide at a concentration of 20% by weight at 25° C., a styrene-conversion weight average molecular weight of 295,000 as determined by gel permeation chromatography and a weight average molecular weight of 271,000 as determined by light scattering method. Further, the high molecular weight epoxy resin had a reduced viscosity of 1.050 dl/g as measured in N,N-dimethylacetamide at a concentration of 0.3 g/dl at 30° C. The high molecular weight epoxy resin was insoluble in methyl ethyl ketone.

After the resultant reaction solution containing the high molecular weight epoxy resin was applied to a surface of a glass plate, the glass plate was dipped gently in a large amount of distilled water which was a first solvent for solvent-exchange. The glass plate coated with the solution of the high molecular weight epoxy resin was taken out 30 minutes after, and was then immediately dipped gently in a large amount of a hot distilled water (90° C.) which was a second solvent for solvent-exchange. The glass plate was taken out 30 minutes after, and, subsequently, an epoxy resin film formed on the glass plate was peeled off from the glass plate and was then dried by heating at 105° C. for one hour in a drier.

The epoxy resin film was white and opaque immediately after it had been taken out from the hot distilled water, but became light yellow and transparent after the drying by heating. The resultant epoxy resin film had a thickness of 28 μm, a tensile strength of 18 MPa and an elongation of 260%, and could attach two stainless steel plates together by using pressure at 180° C.

EXAMPLE 27

The procedure of Example 26 was repeated with the exception that methanol was used as a first solvent for solvent-exchange in place of the distilled water, hexane was used as a second solvent for solvent-exchange in place of the hot distilled water, and the drying temperature was changed to 80° C., to obtain an epoxy resin film.

The resultant epoxy resin film had a thickness of 25 μm, a tensile strength of 25 MPa and an elongation of 180%, and could attach two stainless steel plates together by using pressure at 150° C.

EXAMPLE 28

The procedure of Example 26 was repeated with the exception that tetrahydrofuran was used as a first solvent for solvent-exchange in place of the distilled water, diethyl ether was used as a second solvent for solvent-exchange in place of the hot distilled water, and the drying temperature was changed to 70° C., to obtain an epoxy resin film.

The resultant epoxy resin film had a thickness of 21 μm, a tensile strength of 17 MPa and an elongation of 190%, and could attach two stainless steel plates together by using pressure at 130° C.

EXAMPLE 29

173.2 g of a bisphenol A epoxy resin (epoxy equivalent weight: 173.2) as a difunctional epoxy resin, 55.2 g of hydroquinone (hydroxyl equivalent weight: 55.2) as a dihydric phenol and 0.72 g of lithium hydroxide as a catalyst were dissolved in N,N-dimethylacetamide as a solvent to prepare a reaction solution having a solids concentration (the proportion of the total of the bisphenol A epoxy resin and hydroquinone based on the total of the bisphenol A epoxy resin, hydroquinone and N,N-dimethylacetamide) of 20% by weight. The temperature of the reaction system was maintained at 110° C. for 6 hours to obtain a solution of a high molecular weight epoxy resin. The obtained high molecular weight epoxy resin had a viscosity of 10,900 mPa.s as measured in N,N-dimethylacetamide at a concentration of 20% by weight at 25° C., a styrene-conversion weight average molecular weight of 625,000 as determined by gel permeation chromatography and a weight average molecular weight of 559,000 as determined by light scattering method. Further, the high molecular weight epoxy resin had a reduced viscosity of 1.240 dl/g as measured in N,N-dimethylacetamide at a concentration of 0.3 g/dl at 30° C. The high molecular weight epoxy resin was insoluble in methyl ethyl ketone.

After the resultant reaction solution containing the high molecular weight epoxy resin was applied to a surface of a glass plate, the glass plate coated with the solution was dipped gently in a large amount of methanol which was a first solvent for solvent-exchange. The glass plate was taken out 30 minutes after, and was then immediately dipped gently in a large amount of hot distilled water (90° C.) which was a second solvent for solvent-exchange. The glass plate was taken out 30 minutes after, and subsequently, an epoxy resin film formed on the glass plate was peeled off from the glass plate and was then dried by heating at 105° C. for one hour in a drier.

The resultant epoxy resin film had a thickness of 31 μm, a tensile strength of 22 MPa and an elongation of 420%, and could attach two stainless steel plates together by using pressure at 180° C.

EXAMPLE 30

173.2 g of a bisphenol A epoxy resin (epoxy equivalent weight: 173.2) as a difunctional epoxy resin, 55.2 g of resorcinol (hydroxyl equivalent weight: 55.2) as a dihydric phenol and 1.2 g of sodium hydroxide as a catalyst were dissolved in N,N-dimethylacetamide as a solvent to prepare a reaction solution having a solids concentration (the proportion the total of the bisphenol A epoxy resin and resorcinol based on the total of the bisphenol A epoxy resin, resorcinol and N,N-dimethylacetamide) of 20% by weight. The temperature of the reaction system was maintained at 100° C. for 8 hours to obtain a solution of a high molecular weight epoxy resin. The obtained high molecular weight epoxy resin had a viscosity of 2,900 mPa.s as measured in N,N-dimethylacetamide at a concentration of 20% by weight at 25° C., a styrene-conversion weight average molecular weight of 451,000 as determined by gel permeation chromatography and a weight average molecular weight of 401,000 as determined by light scattering method. Further, the high molecular weight epoxy resin had a reduced viscosity of 1.185 dl/g as measured in N,N-dimethylacetamide at a concentration of 0.3 g/dl at 30° C. The high molecular weight epoxy resin was insoluble in methyl ethyl ketone.

After the resultant reaction solution containing the high molecular weight epoxy resin was applied to a surface of a glass plate, the glass plate coated with the solution was dipped gently in a large amount of acetone which was a first solvent for solvent-exchange. The glass plate was taken out 30 minutes after, and was then immediately dipped gently in a large amount of chloroform which was a second solvent for solvent-exchange. The glass plate was taken out 30 minutes after, and, subsequently, an epoxy resin film formed on the glass plate was peeled off from the glass plate and was then dried by heating at 80° C. for one hour in a drier.

The resultant epoxy resin film had a thickness of 22 μm, a tensile strength of 27 MPa and an elongation of 150%, and could attach two stainless steel plates together by using pressure at 150° C.

EXAMPLE 31

171.3 g of a bisphenol A epoxy resin (epoxy equivalent weight: 171.3) as a difunctional epoxy resin, 115.5 g of bisphenol A (hydroxy equivalent weight: 115.5) as a dihydric phenol and 1.62 g of sodium methoxide as a catalyst were dissolved in N,N-dimethylacetamide as a solvent to prepare a reaction solution having a solids concentration (the proportion of the total of the bisphenol A epoxy resin and bisphenol A based on the total of the bisphenol A epoxy resin, bisphenol A and N,N-dimethylacetamide) of 20% by weight. The temperature of the reaction system was maintained at 120° C. for 6 hours to obtain a 20% by weight solution of a high molecular weight epoxy resin. The obtained high molecular weight epoxy resin had a viscosity of 6,800 mPa.s as measured in N,N-dimethylacetamide at a concentration of 20% at 25° C. and was insoluble in methyl ethyl ketone.

The obtained solution of the high molecular weight epoxy resin was applied to both surfaces of a polyimide film of 25 μm thickness, and was then dried by heating at 200° C. for one hour in a drier to obtain an epoxy resin multilayer film of 39 μm thickness, and the properties of the multilayer film were evaluated. The multilayer film was transparent and good in appearance and had a tensile strength of 85.2 MPa, an elongation of 39.0%, a tensile modulus of 950 MPa and a heat decomposition temperature of 355° C.

EXAMPLE 32

173.2 g of a bisphenol A epoxy resin (epoxy equivalent weight: 173.2) as a difunctional epoxy resin, 55.2 g of resorcinol (hydroxyl equivalent weight: 55.2) as a dihydric phenol and 1.20 g of sodium hydroxide as a catalyst were dissolved in N,N-dimethylacetamide as a solvent to prepare a reaction solution having a solids concentration (the proportion of the total of the bisphenol A epoxy resin and resorcinol based on the total of the bisphenol A epoxy resin, resorcinol and N,N-dimethylacetamide) of 20% by weight. The temperature of the reaction system was maintained at 100° C. for 8 hours to obtain a 20% by weight solution of a high molecular weight epoxy resin. The obtained high molecular weight epoxy resin had a viscosity of 2,200 mPa.s as measured in N,N-dimethylacetamide at a concentration of 20% at 25° C. and was insoluble in methyl ethyl ketone.

The obtained solution of the high molecular weight epoxy resin was applied to both surfaces of a polyester film of 25 μm thickness, and was then dried by heating at 200° C. for one hour in a drier to obtain an epoxy resin multilayer film of 45 μm thickness, and the properties of the multilayer film were evaluated. The multilayer film was transparent and good in appearance and had a tensile strength of 64.7 MPa, an elongation of 48.5%, a tensile modulus of 1130 MPa and a heat decomposition temperature of 345° C.

EXAMPLE 33

171.3 g of a bisphenol A epoxy resin (epoxy equivalent weight: 171.3) as a difunctional epoxy resin, 272.0 g of tetrabromobisphenol A (hydroxy equivalent weight: 272.0) as a dihydric phenol and 0.72 g of lithium hydroxide as a catalyst were dissolved in N,N-dimethylacetamide as a solvent to prepare a reaction solution having a solids concentration (the proportion of the total of the bisphenol A epoxy resin and tetrabromobisphenol A based on the total of the bisphenol A epoxy resin, tetrabromobisphenol A and N,N-dimethylacetamide) of 30% by weight. The temperature of the reaction system was maintained at 120° C. for 6 hours to obtain a solution of a high molecular weight epoxy resin. The obtained high molecular weight epoxy resin had a viscosity of 9,600 mPa.s as measured in N,N-dimethylacetamide at a concentration of 30% by weight at 25° C., a styrene-conversion weight average molecular weight of 195,000 as determined by gel permeation chromatography and a weight average molecular weight of 221,000 as determined by light scattering method. Further, the high molecular weight epoxy resin had a reduced viscosity of 1.000 dl/g as measured in N,N-dimethylacetamide at a concentration of 0.3 g/dl at 30° C. The high molecular weight epoxy resin was insoluble in methyl ethyl ketone.

After the resultant reaction solution containing the high molecular weight epoxy resin was applied to a surface of a glass plate, the glass plate was dipped gently in a large amount of distilled water which was a first solvent for solvent-exchange. The glass plate coated with the solution of the high molecular weight epoxy resin was taken out 30 minutes after, and was then immediately dipped gently in a large amount of a hot distilled water (90° C.) which was a second solvent for solvent-exchange. The glass plate was taken out 30 minutes after, and, subsequently, an epoxy resin film formed on the glass plate was peeled off from the glass plate and was then dried by heating at 105° C. for one hour in a drier.

The epoxy resin film was white and opaque immediately after it had been taken out from the hot distilled water, but became light yellow and transparent after the drying by heating. The resultant epoxy resin film had a thickness of 28 μm, a tensile strength of 28 MPa and an elongation of 8.0%, and could attach two stainless steel plates together by using pressure at 180° C.

EXAMPLE 34

The procedure of Example 33 was repeated with the exception that methanol was used as a first solvent for solvent-exchange in place of the distilled water, hexane was used as a second solvent for solvent-exchange in place of the hot distilled water, and the drying temperature was changed to 80° C., to obtain an epoxy resin film.

The resultant epoxy resin film had a thickness of 25 μm, a tensile strength of 35 MPa and an elongation of 10%, and could attach two stainless steel plates together by using pressure at 150° C.

EXAMPLE 35

The procedure of Example 33 was repeated with the exception that tetrahydrofuran was used as a first solvent for solvent-exchange in place of the distilled water, diethyl ether was used as a second solvent for solvent-exchange in place of the hot distilled water, and the drying temperature was changed to 70° C., to obtain an epoxy resin film.

The resultant epoxy resin film had a thickness of 21 μm, a tensile strength of 27 MPa and an elongation of 9.0%, and could attach two stainless steel plates together by using pressure at 130° C.

What is claimed is:

1. An epoxy resin film made of a high molecular weight epoxy resin, the high molecular weight epoxy resin being insoluble in methyl ethyl ketone, having a substantially linear structure and having a reduced viscosity [$\eta sp/c$] of at least 0.6 dl/g as measured in N,N-dimethylacetamide at a concentration of 0.3 g/dl at 30° C., and the epoxy resin film having a thickness of not more than 100 μm, a tensile strength of not less than 10 MPa and an elongation of not less than 5%.

2. The epoxy resin film of claim 1, wherein the epoxy resin film has a tensile strength of not less than 20 MPa.

3. The epoxy resin film of claim 1, wherein the epoxy resin film has an elongation of not less than 10%.

4. The epoxy resin film of claim 1, wherein the epoxy resin film has an elongation of not less than 50%.

5. The epoxy resin film of claim 1, wherein said epoxy resin film is formed by coating a solvent solution of the high molecular weight epoxy resin on a release surface, drying the coating of the solution of the high molecular weight epoxy resin to remove the solvent therefrom and thereafter peeling the resulting film coating away from the release surface to provide a separated film.

6. The epoxy resin film of claim 1, wherein the high molecular weight epoxy resin is prepared by polymerizing a difunctional epoxy resin having two epoxy groups per molecule and a dihydric phenol in an aprotic polar solvent at a reaction temperature ranging from 80° to 130° C. in the presence of a catalyst selected from the group consisting of an alkali metal compound, an alkyl phosphine and an aliphatic cyclic amine, the difunctional epoxy resin and the dihydric phenol being used in quantities which provide a ratio of phenolic hydroxy groups to epoxy groups of from 1:0.9 to 1:1.1 and a proportion of the total of the difunctional epoxy resin and the dihydric phenol at most 50% by weight based on the total of the difunctional epoxy resin, the dihydric phenol and the aprotic polar solvent.

7. The epoxy resin film of claim 6, wherein the difunctional epoxy resin is selected from the group consisting of bisphenol A epoxy resin, bisphenol F epoxy resin, bisphenol S epoxy resin, an alicyclic epoxy resin, an aliphatic linear epoxy resin, a diglycidyl ether of a dihydric phenol, a diglycidyl ether of a dihydric alcohol, a halide thereof and a hydride thereof, and the dihydric phenol is selected from the group consisting of hydroquinone, resorcinol, cathechol, bisphenol A, bisphenol F, a halide thereof and an alkyl substituted compound thereof.

8. The epoxy resin film of claim 6, wherein the difunctional epoxy resin is bisphenol A epoxy resin, the dihydric alcohol is hydroquinone, resorcinol, bisphenol A or tetrabromobisphenol A, and the aprotic polar solvent is N,N-dimethylacetamide or N-methylpyrrolidone.

9. The epoxy resin film of claim 6, wherein the catalyst is an alkali metal compound consisting of the group consisting of hydroxide, halide, an organic acid salt, an alcholate, a phenolate, hydride, borohydride, and an amide of sodium, lithium or potassium.

* * * * *